US006487710B1

(12) United States Patent
Marquez

(10) Patent No.: US 6,487,710 B1
(45) Date of Patent: Nov. 26, 2002

(54) METHOD AND APPARATUS FOR ASSIGNING PLD SIGNAL ROUTES TO INPUT SIGNALS HAVING DIFFERENT VOLTAGE REQUIREMENTS

(75) Inventor: Jose M. Marquez, Mountain View, CA (US)

(73) Assignee: Xilinx, Inc., San Jose, CA (US)

(*) Notice: Subject to any disclaimer, the term of this patent is extended or adjusted under 35 U.S.C. 154(b) by 265 days.

(21) Appl. No.: 09/608,269

(22) Filed: Jun. 30, 2000

(51) Int. Cl.$^7$ .............................................. G06F 17/50
(52) U.S. Cl. ........................................ 716/16; 716/12
(58) Field of Search ................ 716/1, 7–18; 326/37–41

(56) References Cited

U.S. PATENT DOCUMENTS

| | | | |
|---|---|---|---|
| 5,128,871 A | | 7/1992 | Schmitz |
| 5,563,528 A | | 10/1996 | Diba et al. |
| 5,648,912 A | | 7/1997 | Narayanan et al. |
| 5,675,824 A | * | 10/1997 | Steele .......................... 712/1 |
| 6,218,858 B1 | * | 4/2001 | Menon et al. ................. 326/39 |
| 6,271,679 B1 | * | 8/2001 | McClintock et al. ......... 326/38 |

OTHER PUBLICATIONS

Jose M. Marquez, "A Hybrid Router for Multiplexer–Based CPLDs", Jul. 1, 1999, available from Xilinx, Inc., 2100 Logic Drive, San Jose, CA 95124.
Egon Balas et al.:"A Parallel Shortest Augmenting Path Algorithm for the Assignment Problem", 1991, National Science Foundation Grant, pp. 986–1004.
Pierre Kelson, "Fast Parallel Matching in Expander Graphs", Department of Computer Science University of British Columbia 6356 Agricultural Road, Vancouver, B.C., Canada, 1993, pp. 293–299.
Constantine N.K. Osiakwan et al: "A Perfect Speedup Parallel Algorithm for the Assignment Problem on Complete Weighted Bipartite Graphs", Department of Computing and Information Science Queen's University, Kingston, Ontario, Canada, 1990, pp. 293–301.
"The Programmable Logic Data Book 2000", Virtex 2.5 Field Programmable Gate Arrays, Mar. 9, 2000—Preliminary Product Specification. Available from Xilinx Inc., 2100 Logic Drive, San Jose, CA 95124, pp. 4–5.
Scott D. Brown et al.: "Field–Programmable Gate Arrays", Kluwer Academic Publishers, 1993, pp. 133–145.
Gary Chartrand et al.: "Applied and Algorithmic Graph Theory", McGraw–Hill, Inc., 1993, pp. 2–3, 5–6, 25–26, 162–167.
Thomas H. Cormen et al.: "Introduction to Algorithms", the MIT Press, Cambridge MA, 1991, Chapter 27, pp. 600–602.

* cited by examiner

*Primary Examiner*—Matthew Smith
*Assistant Examiner*—Paul Dinh
(74) *Attorney, Agent, or Firm*—LeRoy D. Maunu; Lois D. Cartier

(57) ABSTRACT

Method and apparatus for routing input signals having different voltage requirements in a PLD circuit design. In various example embodiments, the input signals are grouped into logical clusters, wherein the input signals in each logical cluster have a common input voltage standard. Input pins of the device are grouped into physical clusters, wherein each physical cluster is associated with a voltage standard. Each of the physical clusters is paired with a logical cluster and has associated therewith one or more programmable logic elements as determined by the input signals to be routed to the programmable logic elements. For each paired logical cluster and physical cluster, the input signals of the logical cluster are routed from the pins of the physical cluster to the programmable logic elements of the physical cluster.

19 Claims, 6 Drawing Sheets

US 6,487,710 B1

METHOD AND APPARATUS FOR ASSIGNING PLD SIGNAL ROUTES TO INPUT SIGNALS HAVING DIFFERENT VOLTAGE REQUIREMENTS

CROSS-REFERENCE TO PATENT/APPLICATION

The present application is related to commonly assigned U.S. patent application Ser. No. 09/036,535, entitled "METHOD AND APPARATUS FOR ASSIGNING SIGNAL ROUTES VIA AN INTERCONNECT-MULTIPLEXER IN A PLD", to Marquez et al., filed on Mar. 6, 1998 and issued Mar. 6, 2001 as U.S. Pat. No. 6,199,192. The referenced patent application is incorporated herein by reference.

FIELD OF THE INVENTION

The present invention generally relates to assigning signal routes in a programmable logic device (PLD), and more particularly to assigning signal routes to input signals requiring different voltage standards.

BACKGROUND

Example complex programmable logic devices (CPLD) are found in the XC9500 family of CPLDs from Xilinx. The XC9500 CPLDs include input/output blocks (IOBs), function blocks (FBs), and a switch matrix for interconnecting the function blocks and I/O blocks. Such a switch matrix is described in U.S. Pat. No. 5,563,528, entitled, Multiplexer for Programmable Logic Device, to Diba et al, which is incorporated herein by reference. The inputs to the switch matrix are input pins from the IOBs and feedback inputs from the FBs.

The semiconductor industry standard operating voltage has in the past been 5 volts, and all devices on a system board have operated at 5 volts. The IOBs were designed to interface with structures outside the chip using 5 volts as a power supply voltage. However, the industry is presently migrating to lower voltages for faster operation at lower power. Rather than all chips in a system operating at a single voltage, different chips operating at different power supply voltages may be present in a single system. It may be desirable for a CPLD in a mixed-voltage system to interface with chips operating at different voltage levels.

Some devices in the XC9500 family of CPLDs have multiple input banks. An input bank is a set of input pins that are controlled by the same input voltage level ($V_{ref}$). All the pins of a function block belong to the same input bank and are all controlled by the same $V_{ref}$. Each input bank is programmable to support a selected $V_{ref}$. By setting the $V_{ref}$ of certain input banks to the same voltage level, the banks can be viewed as merged into one bank.

As with any programmable logic device, a CPLD has a limited number of pin resources. Thus, for almost any design, a routing solution that makes efficient use of pin resources while satisfying the input banking requirements is desirable. A method and apparatus that address the aforementioned problems, as well as other related problems, are therefore desirable.

SUMMARY OF THE INVENTION

In various embodiments, methods and apparatus for routing input signals having different voltage requirements in a PLD circuit design are provided by the present invention. The input signals are grouped into logical clusters, wherein the input signals in each logical cluster have a common input voltage standard. Programmable logic elements of the device are grouped into physical clusters, whereby input pins associated with the programmable logic elements are also associated with the physical cluster. Each physical cluster is paired with a logical cluster based on the number of input pins available in the physical cluster and the number of input signals to be routed in the logical cluster. The input voltage standards of the logical clusters are thereby assigned to the paired physical clusters. For each paired logical cluster and physical cluster, the input signals of the logical cluster are routed from the pins of the physical cluster to the programmable logic elements of the physical cluster.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings, in which.

DETAILED DESCRIPTION

Various embodiments of the present invention are described as applied to a particular CPLD from Xilinx, Inc. While the invention is not limited in scope to the particular example CPLD, the various embodiments are presented in terms of elements from the CPLD. Those skilled in the art will appreciate that the invention could be applied to PLDs other than the example CPLD.

Figure 1:
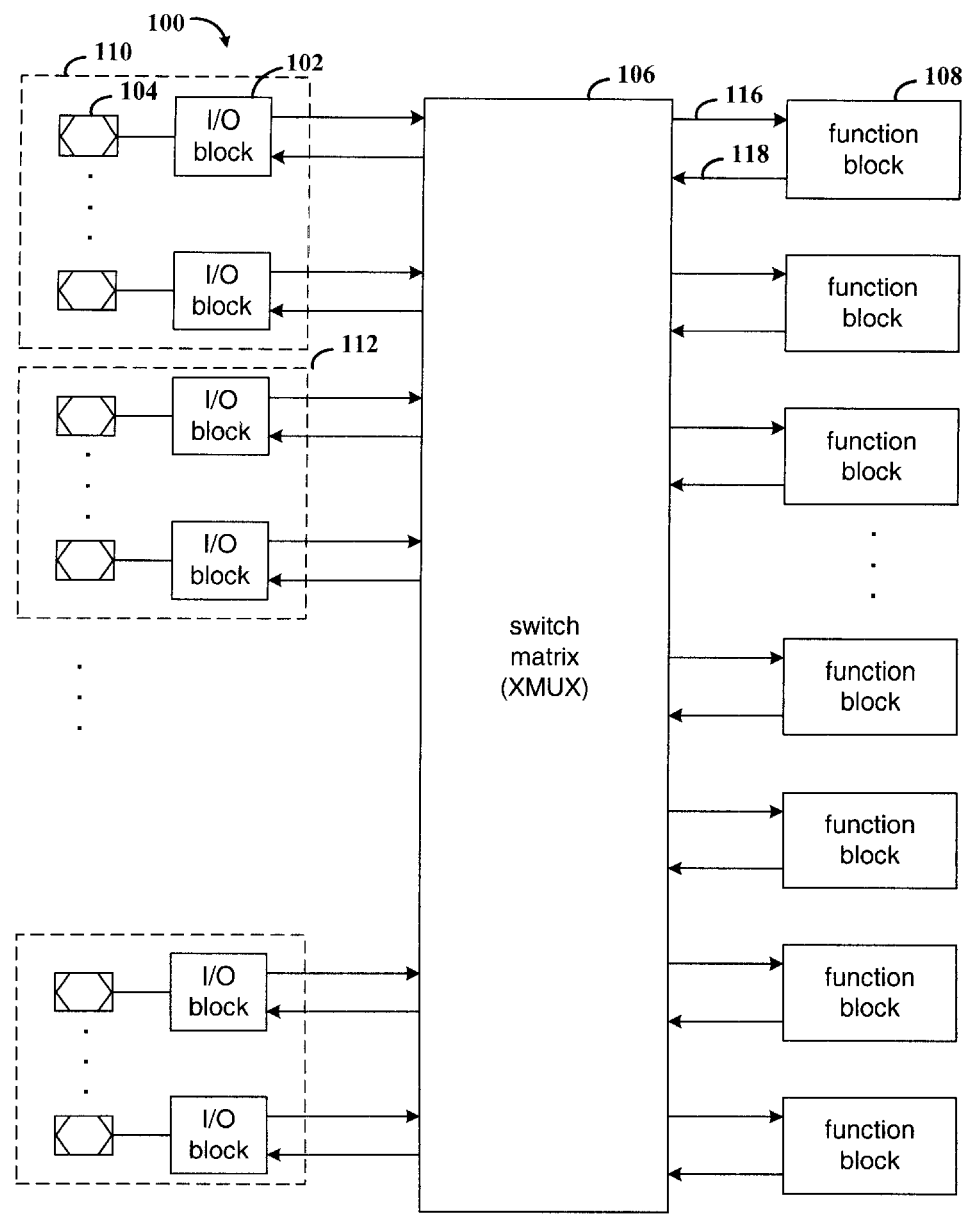
FIG. 1 is a block diagram of the architecture of an example CPLD for which the present invention may be applied in routing signals of a design.

FIG. 1 is a block diagram of the architecture of an example CPLD for which the present invention may be applied in routing signals of a design. It will be appreciated that the embodiments of the invention described below are not limited to example CPLD 100. Designs to be implemented on different CPLD architectures could be routed in accordance with the present invention.

CPLD 100 includes multiple function blocks, for example function block 108, and I/O blocks, for example block 102. The function blocks and I/O blocks are fully interconnected by switch matrix 106, and the I/O blocks are connected to input/output pins, for example I/O block 102 is connected to pin 104. Each function block provides programmable logic capability, and each I/O block provides buffering for device inputs and outputs. For each function block, some outputs and associated output enable signals drive directly to the I/O blocks.

The I/O blocks of CPLD 100 are configurable to support a variety of I/O standards. A sample of voltage levels and I/O standards associated with the voltage levels are set forth in Table 1.

TABLE 1

| Voltage Level ($V_{ref}$) | Input Standard |
|---|---|
| 0.75 v | HSTL-I |
| 0.8 v | GTL |
| 0.90 v | HSTL-III, HSTL-IV |
| 1.0 v | GTL+ |
| 1.25 | SSTL2-I, SSTL2-II |
| 1.32 v | AGP |
| 1.5 v | SSTL3-I, SSTL3-II, CTT |
| no requirement | LVTTL, LVCMOS, PCI |

The I/O blocks of CPLD 100 are grouped into banks, wherein the I/O blocks within a bank are configurable to implement a selected voltage standard. For example, I/O blocks in bank 110 are configurable to implement selected input and output voltage standards, and I/O blocks in bank 112 are configurable to implement the same or different selected input and output voltage standards. It will be appreciated that banks of I/O blocks are independently configurable to input and output standards. The invention described herein is directed to routing input signals.

The function blocks are coupled to switch matrix (XMUX) 106 via input and output signal lines. For example, function block 108 is coupled to XMUX 106 via signal lines 116 and 118. Signal lines 116 are coupled to a plurality of output resources of XMUX 106, and signal lines 118, representing a plurality of feedback lines, are coupled to a plurality of input resources of the XMUX.

A generalized description of the task to be performed by the present invention involves routing a plurality of input signals to the plurality of function blocks via XMUX 106. If signals $a_1, a_2, a_3, \ldots, a_n$ need to be routed to the function blocks, XMUX 106 has input resources $x_1, x_2, x_3, \ldots x_m$ and output resources $y_1, y_2, y_3, \ldots y_k$, and the function blocks require certain ones of the signals $a_{1-n}$, then for each of the function blocks the assignment method must assign signals $a_{1-n}$ to necessary pairs of input/output resources $x_{1-m}$ and $y_{1-k}$ such that all of the function blocks receive the required ones of signals $a_{1-n}$. It will be appreciated that for the example XMUX 106, each input resource of XMUX 106 is connectable to at least three output resources.

Figure 2:
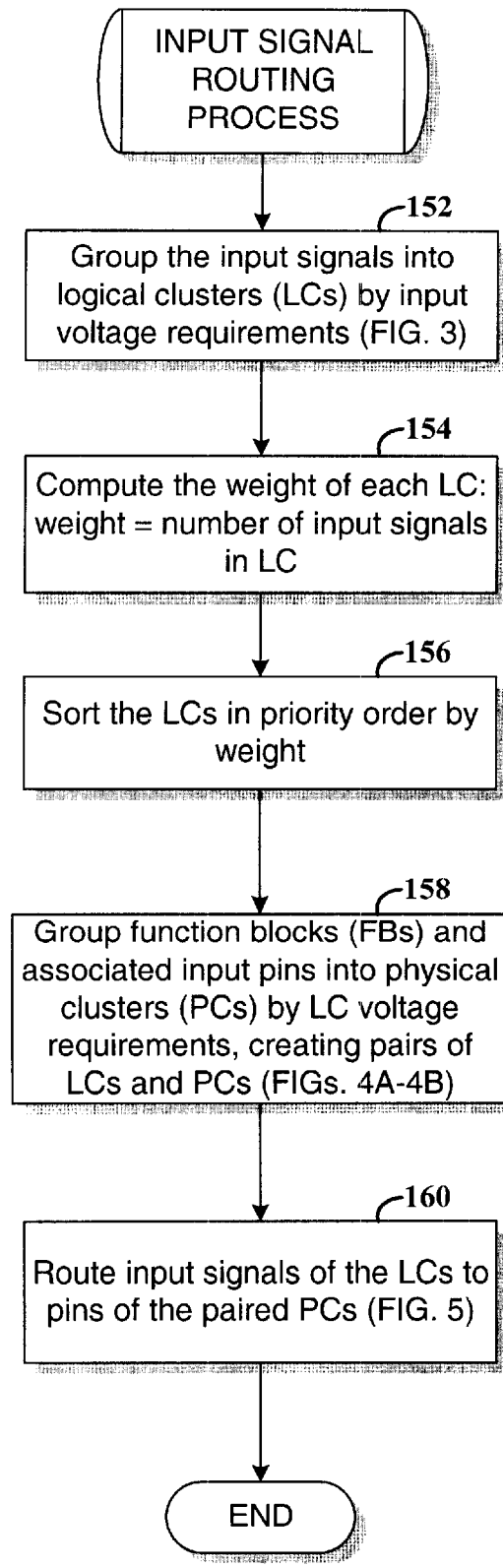
FIG. 2 is a flowchart of a process for routing input signals in accordance with one embodiment of the invention.

FIG. 2 is a flowchart of a process for routing input signals in accordance with one embodiment of the invention. The process generally entails grouping the input signals by $V_{ref}$ requirements, merging input signal groups with compatible $V_{ref}$ requirements, grouping function blocks or FBs (and their associated input pins) to accumulate the number of input pins to match or exceed the number of signals in the input signal groups, pairing the groups of signals with the groups of pins, and lastly, routing the signals. Since banks of I/O blocks are independently configurable to input and output standards and the processes are applied to routing input signals, the banks are referenced herein as "input" banks.

Figure 3:
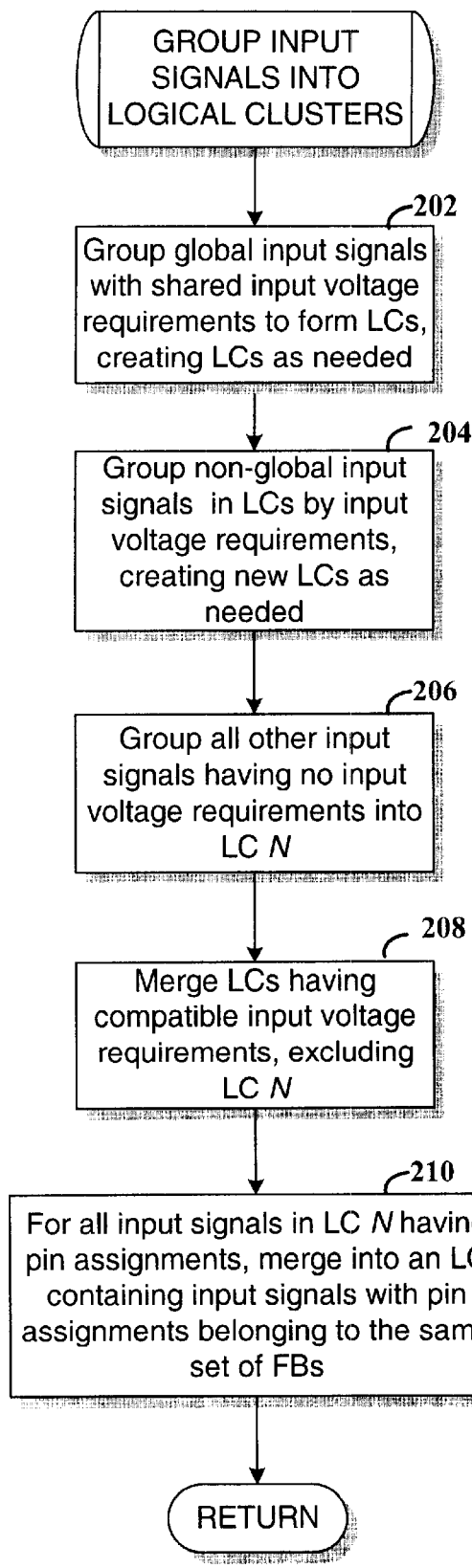
FIG. 3 is a flowchart of a process for grouping the input signals of a design into logical clusters (LCs)

At step 152, the input signals of the design are grouped into logical clusters (LCs) according to the voltage requirements of the signals. Note that FIG. 3 provides further details on the process of creating the LCs. Generally, after the process of step 152, a plurality of LCs exist, wherein the signals in an LC have the same $V_{ref}$ requirement. An LC designated as LC N contains signals that have no $V_{ref}$ requirements, because some designs may have signals with no specified $V_{ref}$ requirement.

At step 154, weights are associated with the LCs, and the LCs are sorted by weight at step 156. The weight of an LC is the number of signals within the cluster, and is used later in pairing with a physical cluster (PC). A PC is a set of one or more function block(s) and their associated pins that are made available for routing.

Figure 4A:
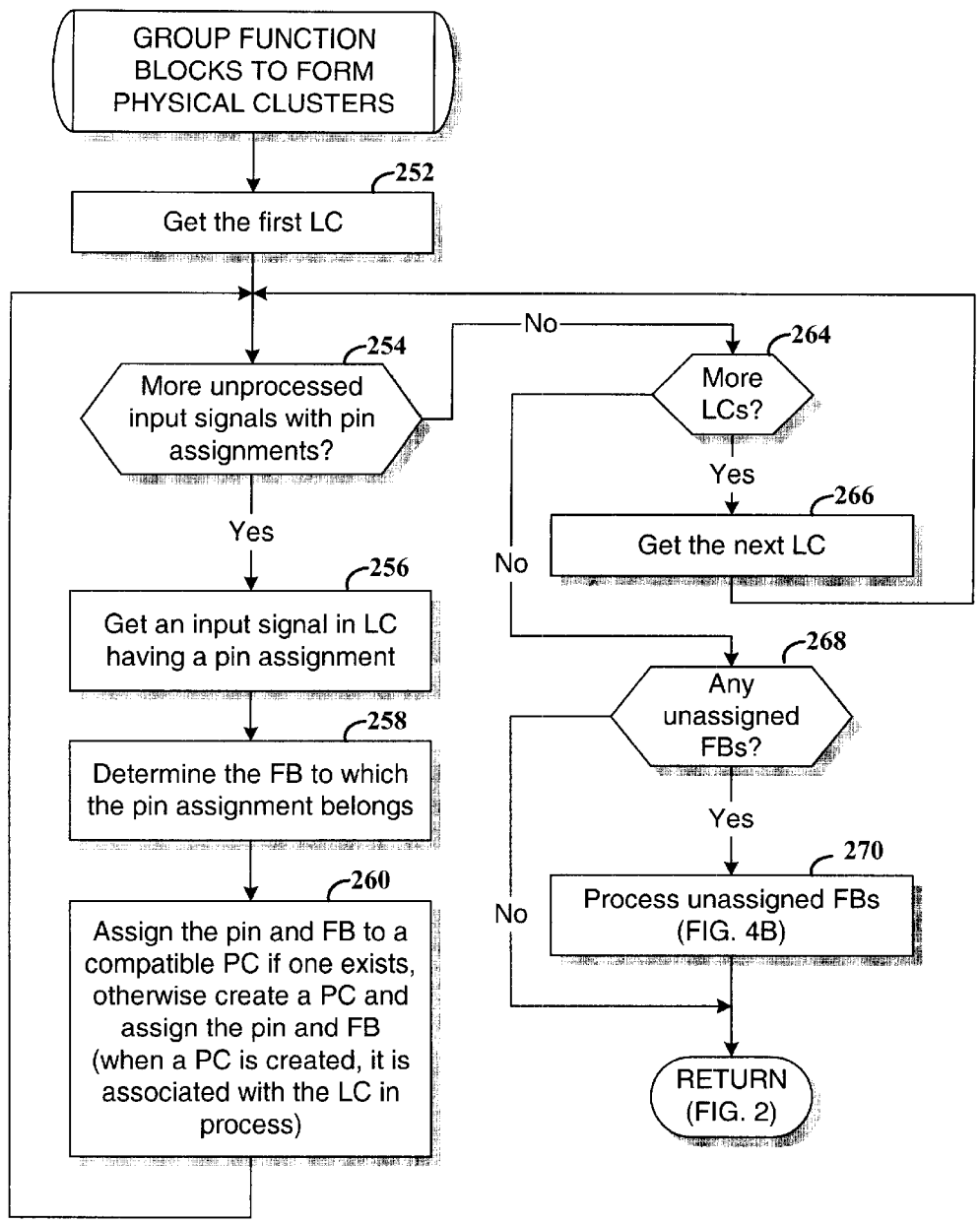
FIG. 4A is a flowchart of a process for creating physical clusters (PCs), which are paired with the previously created logical clusters (LCs)
Figure 4B:
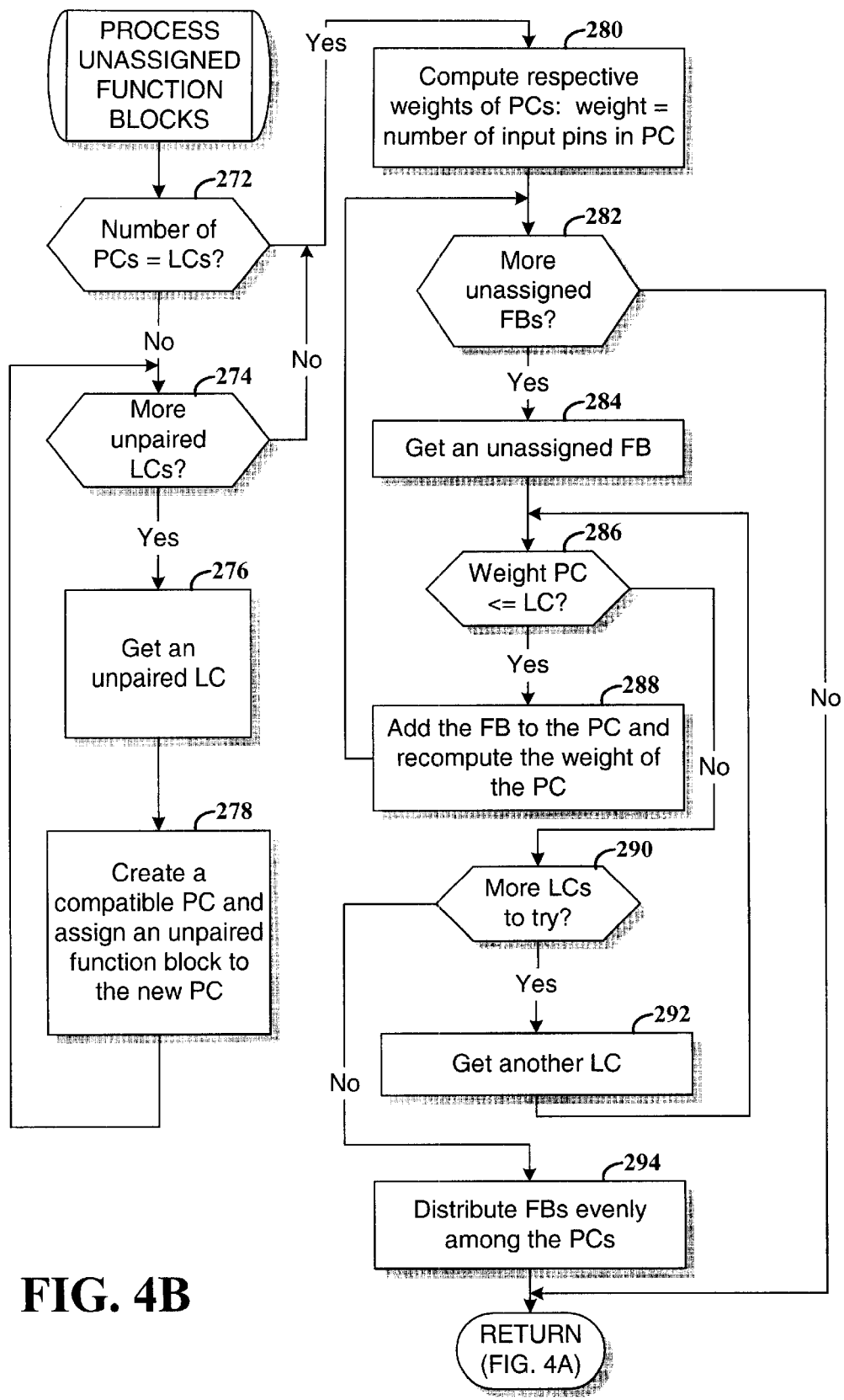
FIG. 4B is a flowchart of a process for processing function blocks that are unassigned to a physical cluster after processing input signals having pin assignments.

At step 158, the function blocks are grouped into physical clusters (PCs). The number of PCs is dictated by the number of LCs formed at step 152. Certain input signals in the LCs may have pin assignments that dictate that these pins be assigned the $V_{ref}$ associated with the LC. Because all pins belonging to a function block share the same $V_{ref}$, the remaining pins of the function block are likewise assigned this $V_{ref}$. Consequently, the other function blocks in the PC (and associated pins) are also assigned this $V_{ref}$. Upon completion of step 158, the LCs have been paired with the PCs. Note that FIGS. 4A and 4B provide further details on the process of creating the PCs.

The input signals are routed at step 160. Specifically, for each LC/PC pair, the input signals of the LC are routed to pins of the PC. The process begins with the LC/PC pair having the greatest LC weight, as sorted at step 156. In one embodiment, the routing method of U.S. patent application Ser. No. 09/036,535, referenced above, is used to perform the route. Those skilled in the art will recognize other suitable alternatives.

FIG. 3 is a flowchart of a process for grouping the input signals of a design into logical clusters (LCs), as in step 152 of FIG. 2.

At step 202, the global input signals of the design are processed first. Global signals generally include, but may not be limited to, clock and tristate signals of a user's design that are mapped to global resources on the device and made available to all function blocks of the device. Local signals, in contrast, are available only to a subset of the function blocks. Global signals map to global pins, and since global pins are a limited resource, the global signals are processed first. The global signals are grouped by creating LCs for the global signals with the same $V_{ref}$ requirements.

At step 204, the non-global input signals are grouped into existing LCs with the same $V_{ref}$. If an LC does not exist for a non-global input signal, one is created. Those non-global signals that have no particular $V_{ref}$ requirements are grouped at step 206 into an LC designated as LC N.

At step 208, LCs having common compatible $V_{ref}$ requirements are merged (see Table 1 above for example compatible $V_{ref}$s). For example, at step 202 a first LC may have been created for the SSTL3-I voltage standard, and a second LC may have been created for the CTT standard. Since both standards specify 1.5 v, the first and second LCs can be combined into a single LC. Note that LC N is excluded from merging at this step. Since the input signals in LC N have no voltage requirements, they can be merged with any LC and routed much later in the process (step 320).

The signals in LC N that have pin assignments are merged at step 210 with a compatible LC. That is, a signal having a pin assignment is removed from LC N and merged with another LC. If an existing LC contains a signal with a pin assignment, and a signal in LC N has a pin assignment belonging to the same function block (since pins are associated with function blocks), then the signal is removed from LC N and added to the LC. If no such LC exists, then the signal is left as part of LC N.

FIG. 4A is a flowchart of a process for creating physical clusters (PCs), which are paired with the previously created logical clusters (LCs) as in step 158 of FIG. 2. As noted above, a PC is a group of function blocks having compatible $V_{ref}$ requirements. Since function blocks have associated pins, the pins of the grouped function blocks will belong to the same input bank and will be available for routing (FIG. 2, step 160).

The first LC (the LC with the greatest weight) is obtained at step 252. Steps 254–260 loop through all input signals with pin assignments in an LC. Decision step 254 controls the loop and tests whether there are any more input signals having pin assignments that have not yet been processed. Step 256 gets from the LC an unprocessed input signal having a pin assignment. Step 258 determines the FB to which the pin assignment belongs. Since it is known which FBs the pins belong to, the identity of the FB can be easily obtained. The FB is then assigned to a compatible PC at step 260, and all the input pins of the FB are associated with the PC. A PC is compatible with an FB if the PC has the same $V_{ref}$ to which the FB's pins will potentially be set. If a compatible PC does not exist, a PC is created with the $V_{ref}$ requirement of the LC being processed. When a PC is created, it is thereby paired with an LC.

As long as there remain unprocessed input signals with pin assignments in the LC, decision step 254 directs control to step 256 to get another input signal to process. When all the signals with pin assignments in an LC have been processed, processing is directed to decision step 264. Decision step 264 tests whether there are more LCs to process, and step 266 gets the next (by weight) LC. When all the LCs have been processed, control is directed to decision step 268.

Decision step 268 tests whether there remain any FBs that have not been associated with PCs. Since thus far only the input signals having pin assignments have been processed, there may remain FBs that are not assigned to a PC. If unassigned FBs remain, control is directed to step 270, where the unassigned FBs are processed (see FIG. 4B). Control is returned to begin step 160 of FIG. 2 when all the FBs have been assigned to PCs.

FIG. 4B is a flowchart of a process for processing function blocks that are unassigned to a physical cluster after processing input signals having pin assignments. Decision step 272 tests whether all the LCs have paired PCs by comparing the number of PCs and LCs. If there are unpaired LCs, control is directed to step 274, which controls a process loop of creating PCs for the unpaired LCs. Step 276 gets an unpaired LC. Step 278 creates a PC with an associated input voltage requirement that is compatible with the unpaired LC, thereby pairing the new PC with the unpaired LC. At step 278, an unassigned FB is assigned to the newly created PC, and control is returned to decision step 274. When all the LCs have been paired, processing is directed to step 280.

If all the LCs are paired with PCs, control is directed to step 280 where the weights of the PCs are computed. The weight of a PC is equal to the number of input pins in the PC. Decision step 282 controls a processing loop for processing the unassigned FBs; as long as there remain FBs that are unassigned to PCs, the process loop continues. Since all FBs have programmable input bank designations, the unassigned FBs are those not yet having an input bank designation (FBs not yet having a set $V_{ref}$)

Step 284 gets an unassigned FB. Since the FB does not yet have a set $V_{ref}$, it may be assigned to any PC. The process used to select an appropriate PC compares the weights of the PCs to the weights of the paired LCs, beginning with the PC paired with the LC having the greatest weight and proceeding with LCs in order of descending weights. If the weight of the in-process PC is less than or equal to the weight of the paired LC (decision step 286), the FB is added to the PC at step 288 and the weight of the PC is re-computed. It is desirable to add an FB to a PC having a weight less than the weight of the paired LC, because adding the FB increases the pin resources of the PC that are available to route signals of the paired LC. Processing then returns to decision step 282.

If the weight of the in-process PC is greater than the weight of the paired LC, control is directed to decision step 290. Decision step 290 tests whether there are more LCs to process. If so, processing is directed to step 292 to get the next LC.

If unassigned FBs still remain and there is no PC having a weight less than or equal to the weight of the paired LC, then the FBs are evenly distributed across the PCs. Control is returned to the process of FIG. 4A when the FBs have been assigned.

Figure 5:
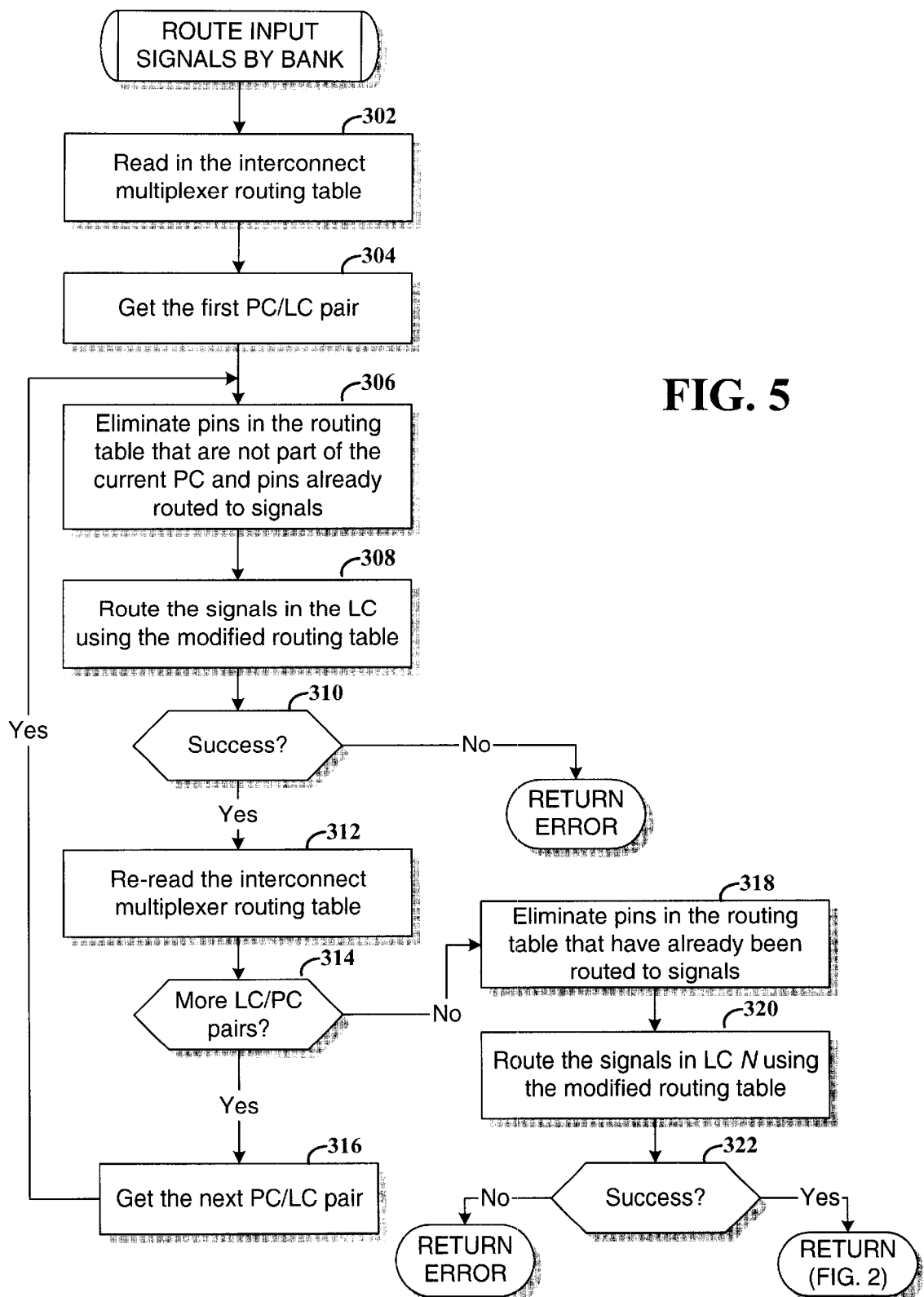
FIG. 5 is a flowchart of a process for routing the signals between pairs of logical and physical clusters.

FIG. 5 is a flowchart of a process for routing the signals between pairs of logical and physical clusters, as in step 160 of FIG. 2.

At step 302, the interconnect multiplexer routing table is read. As described in U.S. patent application Ser. No. 09/036,535, referenced above, the routing table describes which output resources of XMUX 106 are connectable to which input resources. The following table illustrates a small portion of an example interconnect table:

| Inputs | | | Outputs |
|---|---|---|---|
| 0 | 1 | 2 | 0 |
| F1 | 2 | | 1 |
| 1 | F0 | F1 | 2 |

This table illustrates an arrangement in which XMUX input 0 can be connected only to XMUX output 0, feedback input F1 can be connected to both of XMUX outputs 1 and 2, etc.

The input signals are routed by LC/PC pair, beginning with the pair with the greatest LC weight. The LC weight is computed to determine the number of signals that must be grouped together. The LC having the most signals is the most difficult to route and is therefore routed first. At step 304, the first LC/PC pair is obtained. Since the pairs with the greatest weight are those with the most signals, and those with the most signals are the most difficult to route, the pairs with greater weights are processed before pairs with lesser weights.

At step 306, the routing table is modified by removing selected pins. For example, pins in the routing table that are not associated with the current PC are removed, along with pins that are already assigned to input signals in the other LCs. This step ensures that only those pins that share a $V_{ref}$ and are not already routed to signals are used for routing.

At step 308 the signals in the LC are routed using the modified routing table and the processes of U.S. patent application Ser. No. 09/036,535. If the route is successful, the process is repeated for the other PC/LC pairs. (If the route is not successful, an error is returned.) At step 312, the interconnect multiplexer routing table is re-read, and decision step 314 tests whether there are more LC/PC pairs to process. If so, step 316 gets the next pair and directs the process to step 306. Otherwise, the process is directed to step 318.

Steps 318 and 320 process any input signals remaining in LC N. Note that input signals in LC N can be routed to any pin, because these signals either have no voltage requirements or have voltage requirements that are compatible with all other voltage requirements (e.g., TTL, as seen in Table 1). At step 318, the routing table is modified one last time by removing pins that have been assigned from routing the previous PC/LC pairs, and at step 320 the signals in LC N are routed using the modified routing table. If the route is successful, control is returned to the process of FIG. 2. Otherwise, an error is returned.

The present invention is believed to be applicable to assigning signal routes to input signals of different voltage standards in a variety of programmable logic devices. While the invention has been described in terms of a particular CPLD, it will be recognized that the invention is not limited thereto. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for routing input signals in a PLD circuit design from input pins to programmable logic elements, wherein predetermined ones of the input signals have assigned thereto a plurality of different input voltage standards, the method comprising:

creating logical clusters of input signals, wherein the input signals in each logical cluster have a common input voltage standard;

creating physical clusters of input pins, wherein each physical cluster is associated with an input voltage standard and has associated therewith one or more programmable logic elements;

pairing the logical clusters with the physical clusters, wherein a paired logical cluster and physical cluster are compatible with the same input voltage standard; and for each paired logical cluster and physical cluster, routing the input signals of the logical cluster from the input pins of the physical cluster to the programmable logic elements of the physical cluster.

2. The method of claim 1, further comprising:

creating a last logical cluster of input signals having no associated voltage standard; and routing the input signals of the last logical cluster after routing input signals of the other logical clusters.

3. The method of claim 2, wherein one or more of the input signals have predetermined pin assignments and further comprising:

removing input signals having predetermined pin assignments from the last logical cluster; and adding each removed input signal to a logical cluster that is paired with a physical cluster having a pin to which the removed input signal is assigned.

4. The method of claim 1, further comprising creating logical clusters for global input signals before creating logical clusters for non-global input signals.

5. The method of claim 1, further comprising combining logical clusters having compatible input voltage standards.

6. The method of claim 1, further comprising:

assigning respective weights to the logical clusters, wherein the weight of a logical cluster is the number of input signals in the logical cluster;

sorting the logical clusters in order of weight; and routing the input signals of logical clusters in order such that the logical cluster having the greatest weight is routed prior to the logical cluster having the least weight.

7. The method of claim 6, wherein the physical clusters are created after the logical clusters.

8. The method of claim 7, wherein creating the physical clusters comprises:

for each logical cluster, creating a paired physical cluster if the logical cluster has an input signal with a pin assignment, and associating programmable logic elements of the input signals having pin assignments with the physical clusters;

if after creating physical clusters from input signals having pin assignments there remain programmable logic elements that are not associated with physical clusters and there remain unpaired logical clusters, then creating a new physical cluster for each unpaired logical cluster and assigning to the new physical clusters programmable logic elements that are associated with the signals in the unpaired logical clusters; and if after creating physical clusters from input signals having pin assignments there remain programmable logic elements that are not associated with physical clusters and all logical clusters are paired with physical clusters, then, assigning respective weights to the physical clusters, wherein the weight of a physical cluster is the number of input pins in the physical cluster; and if the weight of a physical cluster is less than the weight of a paired logical cluster, then associating a programmable logic element with the physical cluster, otherwise, assigning the programmable logic elements evenly among all the physical clusters.

9. A computer-implemented method for routing input signals in a PLD circuit design from input pins to programmable logic elements via an interconnect multiplexer, wherein the interconnect multiplexer has a plurality of input resources coupled to the input pins and a plurality of output resources programmably coupled to the programmable logic elements, and wherein the input signals are compatible with a plurality of different input voltage standards, the method comprising:

creating logical clusters of input signals, wherein the input signals in each logical cluster have a common input voltage standard;

creating physical clusters of input pins, wherein each physical cluster is associated with an input voltage standard and has associated therewith one or more programmable logic elements;

pairing the logical clusters with the physical clusters, wherein a paired logical cluster and physical cluster are compatible with the same input voltage standard; and for each paired logical cluster and physical cluster, routing the input signals of the logical cluster from the pins of the physical cluster to the programmable logic elements of the physical cluster via the interconnect multiplexer input resources and the interconnect multiplexer output resources.

10. The method of claim 9, further comprising:

creating a last logical cluster of input signals having no associated voltage standard; and routing the input signals of the last logical cluster after routing input signals of the other logical clusters.

11. The method of claim 10, wherein one or more of the input signals have predetermined pin assignments and further comprising:

removing input signals having predetermined pin assignments from the last logical cluster; and adding each removed input signal to a logical cluster that is paired with a physical cluster having a pin to which the removed input signal is assigned.

12. The method of claim 9, further comprising creating logical clusters for global input signals before creating logical clusters for non-global input signals.

13. The method of claim 9, further comprising combining logical clusters having compatible input voltage standards.

14. The method of claim 9, further comprising:

assigning respective weights to the logical clusters, wherein the weight of a cluster is the number of input signals in the cluster;

sorting the logical clusters in order of weight; and routing the input signals of logical clusters in order such that the logical cluster having the greatest weight is routed prior to the logical cluster having the least weight.

15. The method of claim 14, wherein the physical clusters are created after the logical clusters.

16. The method of claim 15, wherein creating the physical clusters comprises:

for each logical cluster, creating a paired physical cluster if the logical cluster has an input signal with a pin assignment, and associating programmable logic elements of the input signals having pin assignments with the physical clusters;

if after creating physical clusters from input signals having pin assignments there remain programmable logic elements that are not associated with physical clusters and there remain unpaired logical clusters, then creating a new physical cluster for each unpaired logical cluster and assigning to the new physical clusters programmable logic elements that are associated with the signals in the unpaired logical clusters; and if after creating physical clusters from input signals having pin assignments there remain programmable logic elements that are not associated with physical clusters and all logical clusters are paired with physical clusters, then, assigning respective weights to the physical clusters, wherein the weight of a physical cluster is the number of input pins in the physical cluster; and if the weight of a physical cluster is less than the weight of a paired logical cluster, then associating a programmable logic element with the physical cluster, otherwise, assigning the programmable logic elements evenly among all the physical clusters.

17. The method of claim 9, further comprising:

in routing each paired logical cluster and physical cluster, constructing a table that specifies which output resources of the interconnect multiplexer are connectable to which input resources; and removing from the table input resources associated with pins that are not part of the physical cluster and pins routed to input signals.

18. The method of claim 17, further comprising:

creating a last logical cluster having input signals that have no associated input voltage standard; and routing input signals in the last logical cluster after routing the input signals in the pairs of logical clusters and physical clusters.

19. The method of claim 18, wherein routing the input signals in the last logical cluster further comprises:

constructing a table that specifies which output resources of the interconnect multiplexer are connectable to which input resources; and removing from the table input resources associated with pins routed to input signals.

\* \* \* \* \*